United States Patent

Edamatsu et al.

Patent Number: 5,843,616
Date of Patent: Dec. 1, 1998

[54] POSITIVE RESIST COMPOSITION

[75] Inventors: Kunishige Edamatsu, Toyonaka; Yuji Yoshida, Mioo; Kazuhiko Hashimoto, Ibaraki; Haruyoshi Osaki, Toyonaka, all of Japan

[73] Assignee: Sumitomo Chemical Company, Ltd., Osaka, Japan

[21] Appl. No.: 419,604

[22] Filed: Apr. 10, 1995

[30] Foreign Application Priority Data

Apr. 11, 1994 [JP] Japan ................................ 6-072211
Sep. 9, 1994 [JP] Japan ................................ 6-215910

[51] Int. Cl.$^6$ ........................................ G03F 7/023
[52] U.S. Cl. ...................... 430/192; 430/165; 430/193
[58] Field of Search ........................ 430/165, 192, 430/193

[56] References Cited

U.S. PATENT DOCUMENTS

| | | | |
|---|---|---|---|
| 4,123,279 | 10/1978 | Kobayashi | 430/192 |
| 5,182,184 | 1/1993 | Lazarus et al. | 430/192 |
| 5,238,771 | 8/1993 | Goto et al. | 430/165 |
| 5,451,484 | 9/1995 | Nagase et al. | 430/192 |

FOREIGN PATENT DOCUMENTS

| | | |
|---|---|---|
| 16843526 | 3/1989 | Australia . |
| 32352 | 10/1989 | Australia . |
| 0550009 | 7/1993 | European Pat. Off. . |
| 0559204 | 9/1993 | European Pat. Off. . |
| 0571989 | 12/1993 | European Pat. Off. . |
| 62-260146 | 11/1987 | Japan . |
| 0284414 | 3/1990 | Japan . |
| 5181270 | 7/1993 | Japan . |
| 5222156 | 8/1993 | Japan . |
| 6194829 | 8/1993 | Japan . |

*Primary Examiner*—John S. Chu
*Attorney, Agent, or Firm*—Birch, Stewart, Kolasch & Birch, LLP

[57] ABSTRACT

A positive resist composition sensitive to radiations such as ultraviolet rays, far ultraviolet rays, which comprises;

an o-quinonediazide compound; and a novolac resin(1) obtained by allowing an aromatic aldehyde of the formula(I)

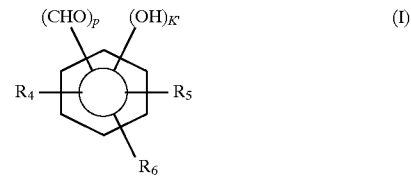

wherein $R_4$ to $R_6$ represents hydrogen, alkyl, cycloalkyl, alkoxy, alkenyl or aryl, k'0 represents an integer not smaller than 0 and p represents 1, 2 or 3, to react with a phenol compound of the formula (II)

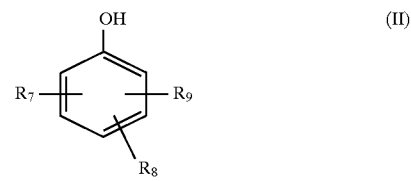

wherein $R_7$ to $R_9$ represents hydrogen, hydroxy, alkyl, cycloalkyl, alkoxy, alkenyl or aryl, provided that at least one of $R_7$ to $R_9$ is cycloalkyl having 6 or less carbon atoms, in the presence of an acid catalyst to obtain a reaction product(1) containing low molecular weight ingredients;

and, then, allowing the reaction product(1) to further react with a phenol compound(1) and formaldehyde.

13 Claims, 2 Drawing Sheets

POSITIVE RESIST COMPOSITION

FIELD OF THE INVENTION

The present invention relates to a positive resist composition sensitive to radiations such as ultraviolet rays, far ultraviolet rays including excimer laser, electron beams, ion beams, X rays, etc.

DESCRIPTION OF THE RELATED ART

Recently, with a rise in the integration level of integrated circuits, formation of pattern of submicron order is required. As its result, a positive resist composition free from scum (undeveloped residue) and further excellent in properties such as sensitivity, resolution, profile, depth of focus, heat resistance, etc. is demanded. Particularly in the production of 16–64 MDRAMs (Mega-bit dynamic randam access memory), it is necessary to resolve a pattern having a line width of 0.5 μm or less with a good profile and a good depth of focus.

In JP-A-2-84414, particularly claim 5 of the application, there is described a positive photoresist which comprises a novolac resin and a photo sensitizer wherein the novolac resin is a condensation product of (a) a phenol, a phenol derivative or a mixture thereof and (b) an aldehyde which is a condensation product of a mixture of formaldehyde or a formaldehyde precursor and an aldehyde containing a monohydroxy aromatic aldehyde. The positive photoresist, however, is not yet satisfactory in resolution, profile, depth of focus, etc.

DESCRIPTION OF THE INVENTION

It is the object of the present invention to provide a positive resist composition excellent in the balance among properties such as sensitivity, resolution, profile, depth of focus and heat resistance, and free from scum.

As a solution, the present invention provides a positive resist composition(i) which comprises;

an o-quinonediazide compound; and
a novolac resin(1) which is obtained by allowing aldehydes containing an aromatic aldehyde represented by the following formula (I)

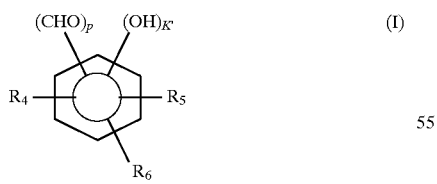

wherein $R_4$ to $R_6$ each independently represents hydrogen, alkyl having 6 or less carbon atoms, cycloalkyl having 6 or less carbon atoms, alkoxy having 6 or less carbon atoms, alkenyl having 6 or less carbon atoms or aryl having 10 or less carbon atoms, k' represents 0, 1, 2 or 3 and p represents 1, 2 or 3, provided that k' and p satisfy $k'+p \leq 3$, to react with a phenol compound represented by the following formula (II)

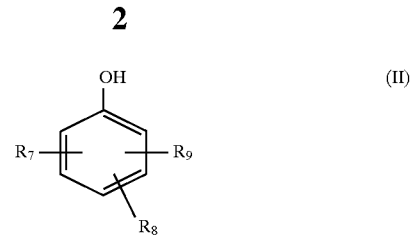

wherein $R_7$ to $R_9$ each independently represents hydrogen, hydroxy, alkyl having 6 or less carbon atoms, cycloalkyl having 6 or less carbon atoms, alkoxy having 6 or less carbon atoms, alkenyl having 6 or less carbon atoms or aryl having 10 or less carbon atoms, provided that at least one of $R_7$ to $R_9$ is cycloalkyl having 6 or less carbon atoms, in the presence of an acid catalyst to obtain a reaction product(1) containing low molecular weight ingredients (hereinafter this reaction step is referred to as "Condensation 1");

and, then, allowing the reaction product(1) or the low molecular weight ingredients isolated from the reaction product(1) to further react with a phenol compound(1) and formaldehyde (hereinafter this reaction step is referred to as "Condensation 2") in the presence of an acid catalyst.

The present invention also provides a positive resist composition(ii) which comprises;

an o-quinonediazide compound; and
a novolac resin(2) which is obtained by allowing a compound represented by the following formula(III)

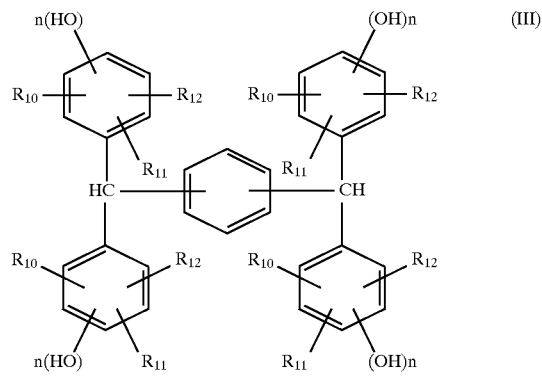

wherein $R_{10}$ to $R_{12}$ each independently represents hydrogen, alkyl having 6 or less carbon atoms, cycloalkyl having 6 or less carbon atoms, alkoxy having 6 or less carbon atoms or alkenyl having 6 or less carbon atoms, provided that at least one of $R_{10}$ to $R_{12}$ is cycloalkyl having 6 or less carbon atoms, and n is 1 or 2; or a compound represented by the following formula(IV)

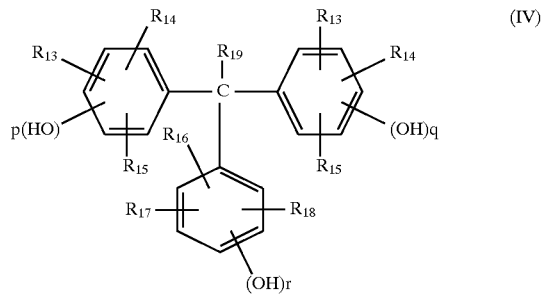

wherein $R_{13}$ to $R_{18}$ each independently represents hydrogen, alkyl having 6 or less carbon atoms, cycloalkyl having 6 or less carbon atoms, alkoxy having 6 or less carbon atoms or alkenyl having 6 or less carbon atoms, $R_{19}$ represents hydrogen, alkyl having 6 or less carbon atoms or aryl having 10 or less carbon atoms, p and q each independently represents 1 or 2 and r represents 0 or 1, provided that at least one of $R_{13}$ to $R_{15}$ is cycloalkyl having 6 or less carbon atoms;

to react with a phenol compound represented by the following formula(V)

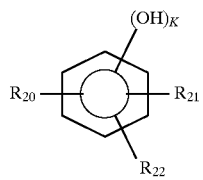

wherein $R_{20}$ to $R_{22}$ each independently represents hydrogen, alkyl having 6 or less carbon atoms, cycloalkyl having 6 or less carbon atoms, alkoxy having 6 or less carbon atoms or alkenyl having 6 or less carbon atoms and k represents 1 or 2; and a aldehyde(1) (hereinafter this reaction step is referred to as "Condensation 3").

In the formula (I), k' is preferably 1 or 2.

As preferred examples of the aromatic aldehyde compound represented by the formula(I), benzaldehyde, methylaldehydes such as 4-methylaldehyde, polyaldehydes such as terephthalaldehyde, hydroxybenzaldehydes such as o-, m- or p-hydroxybenzaldehyde, methoxybenzaldehydes such as o-, m- or p-methoxybenzaldehyde and the like can be mentioned. Among them, hydroxybenzaldehydes are more preferred. In Condensation 1, these aromatic aldehyde can be used independently or in the form of a mixture of two or more. These aromatic aldehyde can be used in a combination with one or more kinds of aliphatic aldehydes other than formaldehyde such as acetaldehyde or glyoxal.

In the mixture of the aromatic aldehyde and the aliphatic aldehydes other than formaldehyde, the content of the aromatic aldehyde is preferably more than 50% by weight, more preferably more than 85% by weight, based on the total amount of the mixture.

As preferable examples of the phenol compound represented by the formula(II), 2-cyclohexyl-5-methylphenol, 2-cyclopentyl-5-methylphenol and a mixture thereof can be mentioned.

In the Condensation 1, the molar ratio of the aromatic aldehyde compound represented by the formula(I) to the phenol compound represented by the formula(II) is preferably from 1:2 to 1:10. Condensation 1 is preferably carried out in the presence of an organic solvent. As preferred examples of the organic solvent, a poor solvent which is relatively difficult to dissolve the aromatic aldehyde compound of the formula(I) and the phenol compound of the formula(I) can be mentioned. Examples of the poor solvent includes methanol, toluene, hexane, heptane, cyclohexane and the like. Among the organic solvents usable for the condensation 1, organic solvents having boiling points of 50°–160° C. are preferred and organic solvents having boiling points of 60°–120° C. are more preferred. Therefore, the above mentioned poor solvents having boiling points of 60°–120° C. are particularly preferred. As the acid catalyst used for the condensation 1, for example, inorganic acids such as hydrochloric acid, sulfuric acid and phosphoric acid, organic acids such as oxalic acid, acetic acid and p-toluenesulfonic acid, and divalent metal salts such as zinc acetate and the like can be used.

In Condensation 1, the reaction temperature is usually 60° to 120° C., and the reaction time is usually 2 to 30 hours. According to Condensation 1 explained above, a reaction product(1) which contains low molecular weight ingredients is obtained.

As example of the low molecular weight ingredients contained in the reaction product(1), a compound represented by the following formula:

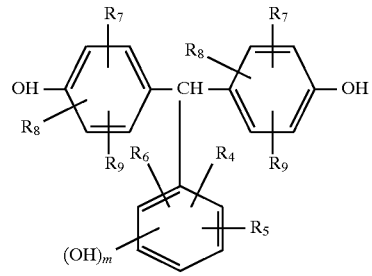

wherein $R_4$ to $R_6$, $R_7$ to $R_9$ and k' are as defined above, and a compound represented by the following formula:

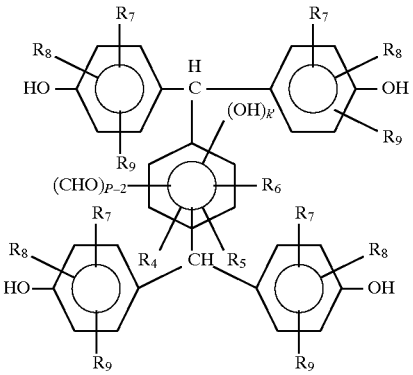

wherein $R_4$ to $R_9$, k' and p are as defined above provided that P-2≧0, can be mentioned.

The low molecular weight ingredients produced by Condensation 1 can be used for the condensation reaction with formaldehyde and a phenol compound(1) (i.e. Condensation 2) after being isolated from the reaction product(1). However, the reaction product(1) itself can also be used for the Condensation 2 without isolating the low molecular weight ingredients from it. Carrying out Condensation 2 without isolating the low molecular weight ingredients is more preferred than carrying out Condensation 2 after isolating them. The isolation of the low molecular weight ingredients can be carried out according to a conventional method such as concentration, crystallization, filtration and drying.

Condensation 2 is carried out after mixing the reaction product(1) or the isolated low molecular weight ingredients, the phenol compound(1) and formaldehyde. Condensation 2 can also be carried out while adding formaldehyde to a mixture of the reaction product(1) or the isolated low molecular weight ingredients and the phenol compound(1).

As phenol compound(1) use in Condensation reaction(2), at least one phenol compound selected from a group consisting of phenol, m-cresol, p-cresol, 2,5-xylenol, 3,5-xylenol, 3,4-xylenol, 2,3,5-trimethylphenol, 2-cyclohexyl-5-methylphenol, 2-cyclopentyl-5-methylphenol and 3-methyl-6-t-butylphenol can be mentioned.

The amount of the formaldehyde used in Condensation 2 is usually 0.4–1 mole, preferably 0.6–0.95 mole per 1 mole of the total of the low molecular weight ingredients and the phenol compound(1). The molar ratio of the low molecular weight ingredients to the phenol compound(1) is preferably from 100:10 to 100:50.

In Condensation 2,the reaction temperature is usually 60° to 120° C. Condensation 2 is preferably carried out in the presence of an organic solvent. Among the organic solvents usable for the condensation 2,organic solvents having boiling points of 50°–160° C. are preferred and organic solvents having boiling points of 60°–12020 C. are more preferred. Examples of the particularly preferred organic solvent include ketones having boiling points of 60°–120° C. such as methylisobutylketone. As the acid catalyst used for the condensation 2,for example, inorganic acids such as hydrochloric acid, sulfuric acid and phosphoric acid, organic acids such as oxalic acid, acetic acid and p-touenesulfonic acid, and divalent metal salts such as zinc acetate and the like can be used.

Preferably, the novolac resin(1) formed by Condensation 2 is made, by a method such as fractionation, into a novolac resin in which the areal ratio of the GPC pattern of a range, wherein a molecular weight as converted to polystyrene is not higher than 900,is 25% or less, and more preferably 20% or less, based on the total pattern area excluding the pattern area of unreacted phenol compounds, as measured by using UV 254 nm detector. The novolac resin(1) can also be made into a novolac resin of which weight average molecular weight as converted to polystyrene is 2000–20000,which is the preferred weight average molecular weight range of the novolac resin(1) as converted to polystyrene.

As preferable examples of the o-quinonediazide compound, o-naphthoquinonediazide compound can be mentioned. Examples of the o-naphthoquinonediazide compound include the compounds obtained by subjecting a phenol compound having two or more hydroxyl groups, preferably three or more hydroxyl groups, and 1,2-naphthoquinone-diazide-4-sulfonic acid halide or 1,2-naphthoquinone-diazide-5-sulfonic acid halide to a condensation reaction in the presence of a weak alkali such as triethylamine, sodium carbonate and the like. This o-naphthoquinonediazide compound is used as a photo sensitizer for a positive photo resist in the production of semiconductors.

As preferred examples of said phenol compound having two or more hydroxyl groups, the compounds mentioned in Page 3 of JP-A-2-103543 as a general formula, the compounds mentioned in JP-A-2-32352 as the general formula (I) or (II), the compounds mentioned in JP-A-2-269351 as the general formula (I), the compounds mentioned in Page 4 of JP-A-4-50851,the compounds mentioned in JP-A-3-185447 as the general formula (I), oxyflavans including the compounds mentioned in JP-A-4-295472 as the general formula (I), etc. can be referred to.

The positive resist composition(i) of the present invention may contain other ingredient in addition to the novolac resin and the o-quinonediazide compound. Examples of the other ingredient include an alkali-soluble polyhydric phenol compound of which molecular weight is lower than 900. As examples of said alkali-soluble polyhydric phenol compound of which molecular weight is lower than 900,the compounds mentioned in JP-A-2-275955 as the general formula (I), the compounds mentioned in JP-A-4-50851 as the general formula (I), the compounds mentioned in JP-A-3-179353 as the general formula (I) can be mentioned.

As the solvent used for preparation of the positive resist composition(i), solvents vaporizable at an appropriate rate and capable of giving a uniform and smooth coating film after evaporation can be used. Examples of such solvent include glycol esters such as propylene glycol monomethyl ether acetate, ethyl cellosolve acetate and methyl cellosolve acetate, the solvents mentioned in JP-A-2-220056,esters such as ethyl pyruvate, n-amyl acetate and ethyl lactate and ketones such as 2-heptanone, γ-butyrolactone. These solvents are used either independently or in the form of a mixture of two or more.

The o-quinonediazide compound is usually used in an amount of 10–50% by weight based on the total solid component of the positive resist composition(i). The alkali-soluble polyhydric phenol compound of which molecular weight is lower than 900 is usually used in an amount of 0–40% by weight, preferably 3–40% by weight, based on the total solid component of the positive resist composition(i).

As preferred examples of the compound of the formula (IV), compounds represented by the following formulae:

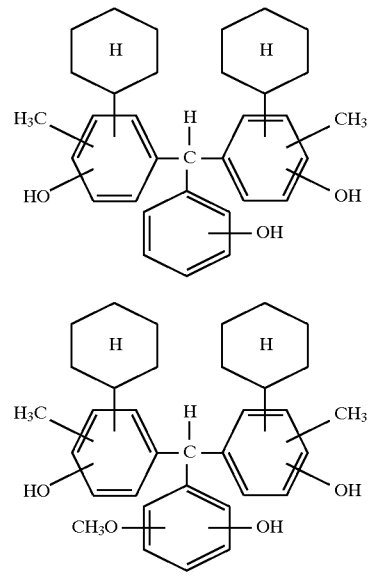

can be mentioned. As more preferred examples of the compound of the formula(IV), compounds represented by the following formulae:

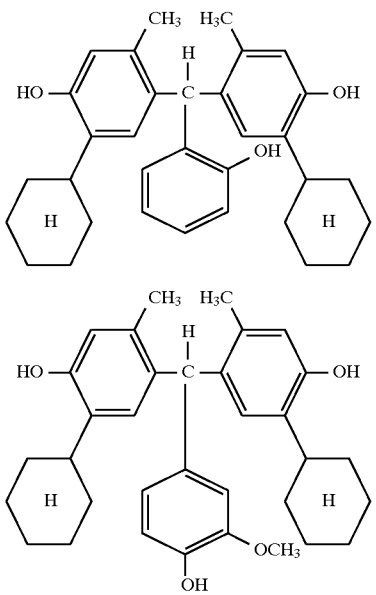

can be mentioned.

As preferable example of the phenol compound represented by the general formula(V), at least one phenol compound selected from a group consisting of phenol, m-cresol, p-cresol, 2,5-xylenol, 3,5-xylenol, 3,4-xylenol, 2,3, 5-trimethylphenol, 2-cyclohexyl-5-methylphenol, 2-cyclopentyl-5-methylphenol and 3-methyl-6-t-butylphenol can be mentioned. In Condensation 3,the molar ratio of the compound of the formula(III) or the compound of the general formula(IV) to the phenol compound of the formula(V) is preferably 0.5:99.5–40:60.

Examples of the aldehyde(1) used in Condensation 3 include a saturated or unsaturated aliphatic aldehydes such as formaldehyde, acetaldehyde, propionaldehyde, n-butylaldehyde, isobutylaldehyde, trimethylacetaldehyde, n-hexylaldehyde, acrolein and crotonaldehyde; cyclohexanealdehyde; cyclopentanealdehyde; furfural; furylacrolein; and aromatic aldehydes such as benzaldehyde, o-, p- or m-tolualdehyde, p-ethylbenzaldehyde, 2,4-dimethylbenzaldehyde, 2,5-dimethylbenzaldehyde, 3,4-dimethylbenzaldehyde, 3,5-dimethylbenzaldehyde, phenylacetaldehyde, o-, p- or m-hydroxybenzaldehyde, cinnamaldehyde, o-, p- or m-anisaldehyde and vanillin. As preferred examples of the aldehyde(1), formaldehyde can be mentioned.

In the condensation reaction of the aldehyde(1) with the compound of the formula(III) or (IV) and the phenol compound of the formula(V), molar ratio of the aldehyde(1) to the total amount of the compound of the formula(III) or (IV) and the phenol compound of the formula(V) is preferably from 1:0.005 to 1:2. Other conditions of this condensation reaction are same as those of Condensation 2.

Preferably, the novolac resin(2) produced by Condensation 3 is made, by a method such as fractionation, into a novolac resin in which the areal ratio of the GPC pattern of a range, wherein a molecular weight as converted to polystyrene is not higher than 900,is 25% or less based on the total pattern area excluding the pattern area of unreacted phenol compounds, as measured by using UV 254 nm detector, as the novolac resin(1). The novolac resin(2) can also be made into a novolac resin of which the weight average molecular weight as converted to polystyrene is 2000–20000,which is the preferred weight average molecular weight range of the novolac resin(2) as converted to polystyrene.

The o-quinonediazide compound used in the positive resist composition(ii) is the same as in the positive resist composition(i).

The positive resist composition(ii) may contain other ingredient in addition to the novolac resin(2) and the o-quinonediazide compound. For example, it may preferably contain an alkali-soluble polyhydric phenol compound of which molecular weight is lower than 900. The contents of the alkali-soluble polyhydric phenol compound of which molecular weight is lower than 900,the novolac resin(2) and the o-quinonediazide compound in the total solid content of the positive resist composition(ii) are the same as in the positive resist composition(i) mentioned above.

The positive resist composition(i) and (ii) of the present invention are excellent in the balance among properties such as sensitivity, resolution, profile, heat resistance, depth of focus, etc. and free from scum.

PREFERRED EMBODIMENT OF THE INVENTION

The present invention is explained in more detail with reference to the following examples. The invention is by no means limited by these examples. In the examples, parts means part by weight.

Synthesis Example 1

A mixture of 113.4 g of 2-cyclohexyl-5-methylphenol, 210.8 g of methanol, 3.6 g of p-toluenesulfonic acid and 18.3 g of salicylaldehyde was allowed to react at 80 20 C. for 4 hours. Then, the reaction product thus obtained was cooled and added to 50% aqueous solution of methanol to obtain a white precipitate. The precipitate was filtrate, washed and dried to obtain 40 g of a white powdery compound(a) represented by the following formula:

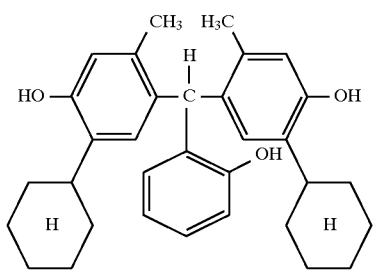

Purity of the white powdery compound(a) measured according to the areametric analysis with liquid chromatography was 99.6%.

FD-MS:m/e=484

Synthesis Example 2

A mixture of 48.9 g of 2-cyclohexyl-5-methylphenol, 105.6 g of methanol, 2.7 g of p-toluenesulfonic acid and 17.1 g of vanilline was allowed to react under the refluxing condition for 4 hours. Then, the reaction product thus obtained was cooled to obtain a precipitate. The precipitate was filtrate, washed with 50% aqueous solution of methanol and dried to obtain 41 g of a compound represented by the following formula:

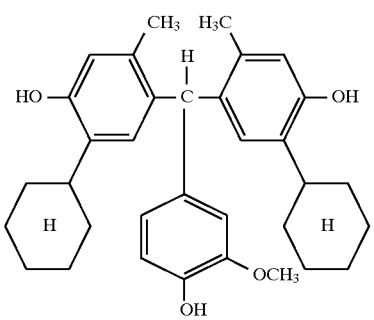

FD-MS: m/e = 514

Synthesis Example 3

To a mixture of 80 g of the compound(a) obtained in Synthesis Example 1, 250 g of methyl isobutyl ketone and 189.2 g of m-cresol, 135.6 g of 37% aqueous solution of formaldehyde was dropwise added over a period of 60 minutes, and the resulting mixture was allowed to react at 90° C. for 8 hours. Then, the reaction mixture was washed with water and dehydrated to obtain a solution of a novolac resin in methyl isobutyl ketone. To the solution thus obtained, 1000 g of 2-heptanon was added and then methyl isobutyl ketone in the solution was distilled off by an evaporator to obtain a solution of a novolac resin in 2-heptanon. As measured by GPC, the product had a polystyrene-converted weight average molecular weight of 4300.

Synthesis Example 4

To a mixture of 80 g of the compound(a) obtained in Synthesis Example 1, 250 g of methyl isobutyl ketone, 189.2 g of m-cresol and 42.8 g of 2,5-xylenol, 161.5 g of 37% aqueous solution of formaldehyde was dropwise added over a period of 60 minutes, and the resulting mixture was allowed to react at 90° C. for 8 hours. Then, the reaction mixture was washed with water and dehydrated to obtain a solution of a novolac resin in methyl isobutyl ketone. To the solution thus obtained, 1000 g of 2-heptanon was added and then methyl isobutyl ketone in the solution was distilled off by an evaporator to obtain a solution of a novolac resin in 2-heptanon. As measured by GPC, the product had a polystyrene-converted weight average molecular weight of 4270.

Synthesis Example 5

To a mixture of 53 g of the compound(a) obtained in Synthesis Example 1, 150 g g of methyl isobutyl ketone, 121.7 g of m-cresol and 27.5 g of 2,5-xylenol, 92.8 g of 37% aqueous solution of formaldehyde was dropwise added over a period of 60 minutes, and the resulting mixture was allowed to react at 90° C. for 8 hours. Then, the reaction mixture was washed with water and dehydrated to obtain a solution of a novolac resin in methyl isobutyl ketone. To the solution thus obtained, 1000 g of 2-heptanon was added and then methyl isobutyl ketone in the solution was distilled off by an evaporator to obtain a solution of a novolac resin in 2-heptanon. As measured by GPC, the product had a polystyrene-converted weight average molecular weight of 7700.

Synthesis Example 6

Synthesis Example 5 was repeated except that the reaction time was changed to 5 hours to obtain a solution of a novolac resin in 2-heptanon. As measured by GPC, the product had a polystyrene-converted weight average molecular weight of 4800.

Synthesis Example 7

Synthesis Example 6 was repeated except that the amounts of m-cresol, 2,5-xylenol and 37% aqueous solution of formaldehyde were changed to 120.6 g, 54.5 g and 114.3 g respectively to obtain a solution of a novolac resin in 2-heptanon. As measured by GPC, the product had a polystyrene-converted weight average molecular weight of 3900.

Synthesis Example 8

To a mixture of 53 g of the compound(a) obtained in Synthesis Example 1, 150 g of methyl isobutyl ketone, 122.7 g of m-cresol and 55.5 g of 2,5-xylenol, 115 g of 37% aqueous solution of formaldehyde was dropwise added over a period of 60 minutes, and the resulting mixture was allowed to react at 90° C. for 6 hours. Then, the reaction mixture was washed with water and dehydrated to obtain a solution of a novolac resin in methyl isobutyl ketone. To the solution thus obtained, 1000 g of 2-heptanon was added and then methyl isobutyl ketone in the solution was distilled off by an evaporator to obtain a solution of a novolac resin in 2-heptanone. As measured by GPC, the product had a polystyrene-converted weight average molecular weight of 4800.

Synthesis Example 9

100 g of a solution of a novolac resin in methyl isobutyl ketone obtained according to the same manner as in Synthesis Example 3, in which the content of novolac resin was 39.2% by weight, was charged to a 1-liter separable flask equipped with a drain pipe at its bottom. To the flask, 50.7 g of methyl isobutyl ketone and 95 g of n-heptane were further added. The content of the flask was stirred at 60° C. for 30 minutes and then left to stand until it separated into two layers. To the under layer thus obtained, 300 g of 2-heptanone was added, and then the methyl isobutyl ketone and n-heptane were removed by means of an evaporator to obtain a solution of novolac resin in 2-heptanone. As measured by GPC, the product thus obtained had a polystyrene-converted weight average molecular weight of 7000, and the areal ratio of the range in which the molecular weight as converted to polystyrene was 900 or less to the total pattern area was 15%.

Synthesis Example 10

100 g of a solution of a novolac resin in methyl isobutyl ketone obtained according to the same manner as in Synthesis Example 4, in which the content of novolac resin was 42% by weight, was charged to a 1-liter separable flask equipped with a drain pipe at its bottom. To the flask, 61.4 g of methyl isobutyl ketone and 101.7 g of n-heptane were further added. The content of the flask was stirred at 60° C. for 30 minutes and then left to stand until it separated into two layers. To the under layer thus obtained 300 g of 2-heptanone was added and then the methyl isobutyl ketone and n-heptane were removed by means of an evaporator to obtain a solution of novolac resin in 2-heptanone. As measured by GPC, the product thus obtained had a polystyrene-converted weight average molecular weight of 7200, and the areal ratio of the range in which the molecular weight as converted to polystyrene was 900 or less to the total pattern area was 16%.

Synthesis Example 11

A mixture of 76.1 g of 2-cyclohexyl-5-methylphenol, 155.9 g of methanol, 4.2 g of p-toluenesulfonic acid and 21.4 g of salicylaldehyde was allowed to react at 80° C. for 4 hours. After the reaction was completed, 317.9 g of methyl isobutyl ketone was added to the reaction product and the resulting solution was distilled until the inner temperature rose to 85° C. in order to remove methanol. After 189.2 g of m-cresol was added thereto, 135.6 g of 37% aqueous solution of formaldehyde was dropwise added over a period of 60 minutes, and the resulting mixture was allowed to react at 90° C. for 8 hours. Then, the reaction mixture was washed with water and dehydrated to obtain a solution of a novolac resin in methyl isobutyl ketone. To the solution thus obtained, 1000 g of 2-heptanon was added and then methyl isobutyl ketone in the solution was distilled off by an evaporator to obtain a solution of a novolac resin in 2-heptanon. As measured by GPC, the product had a polystyrene-converted weight average molecular weight of 4250.

Synthesis Example 12

A mixture of 76.1 g of 2-cyclohexyl-5-methylphenol, 155.9 g of methanol, 4.2 g of p-toluenesulfonicacid and 21.4 g of salicylaldehyde was allowed to react at 80° C. for 4 hours. After the reaction was completed, 317.9 g of methyl isobutyl ketone was added to the reaction product and the resulting solution was distilled until the inner temperature rose to 85° C. to remove methanol. After 189.2 g of m-cresol and 42.8 g of 2,5-xylenol were added thereto, 161.5 g of 37% aqueous solution of formaldehyde was dropwise added over a period of 60 minutes, and the resulting mixture was allowed to react at 90° C. for 8 hours. Then, the reaction mixture was washed with water and dehydrated to obtain a solution of a novolac resin in methyl isobutyl ketone. To the solution thus obtained, 1000 g of 2-heptanon was added and then methyl isobutyl ketone in the solution was distilled off by an evaporator to obtain a solution of a novolac resin in 2-heptanon. As measured by GPC, the product had a polystyrene-converted weight average molecular weight of 4300.

Synthesis Example 13

A mixture of 32.8 g of 2-cyclohexyl-5-methylphenol, 67.2 g of methanol, 1.8 g of p-toluenesulfonic acid and 9.2 g of salicylaldehyde was allowed to react at 80° C. for 4 hours. After the reaction was completed, 177 g of methyl isobutyl ketone was added to the reaction product and the resulting solution was distilled until the inner temperature rose to 85° C. in order to remove methanol. After 121.7 g of m-cresol and 27.5 g of 2,5-xylenol were added thereto, 92.8 g of 37% aqueous solution of formaldehyde was dropwise added over a period of 60 minutes, and the resulting mixture was allowed to react at 90° C. for 8 hours. Then, the reaction mixture was washed with water and dehydrated to obtain a solution of a novolac resin in methyl isobutyl ketone. To the solution thus obtained, 1000 g of 2-heptanon was added and then methyl isobutyl ketone in the solution was distilled off by an evaporator to obtain a solution of a novolac resin in 2-heptanon. As measured by GPC, the product had a polystyrene-converted weight average molecular weight of 7800.

Synthesis Example 14

A mixture of 32.8 g of 2-cyclohexyl-5-methylphenol, 67.2 g of methanol, 1.8 g of p-toluenesulfonic acid and 9.2 g of salicylaldehyde was allowed to react at 80° C. for 4 hours. After the reaction was completed, 177 g of methyl isobutyl ketone was added to the reaction product and the resulting solution was distilled until the inner temperature rose to 85° C. in order to remove methanol. After 121.7 g of m-cresol and 27.5 g of 2,5-xylenol were added thereto, 92.8 g of 37% aqueous solution of formaldehyde was dropwise added over a period of 60 minutes, and the resulting mixture was allowed to react at 90° C. for 5 hours. Then, the reaction mixture was washed with water and dehydrated to obtain a solution of a novolac resin in methyl isobutyl ketone. To the solution thus obtained, 1000 g of 2-heptanon was added and then methyl isobutyl ketone in the solution was distilled off by an evaporator to obtain a solution of a novolac resin in 2-heptanon. As measured by GPC, the product had a polystyrene-converted weight average molecular weight of 4900.

Synthesis Example 15

A mixture of 32.5 g of 2-cyclohexyl-5-methylphenol, 66.6 g of methanol, 1.8 g of p-toluenesulfonic acid and 9.1 g of salicylaldehyde was allowed to react at 80° C. for 4 hours. After the reaction was completed, 177 g of methyl isobutyl ketone was added to the reaction product and the resulting solution was distilled until the inner temperature rose to 85° C. in order to remove methanol. After 120.6 g of m-cresol and 54.5 g of 2,5-xylenol were added thereto, 114.3 g of 37% aqueous solution of formaldehyde was dropwise added over a period of 60 minutes, and the resulting mixture was allowed to react at 90° C. for 5 hours. Then, the reaction mixture was washed with water and dehydrated to obtain a solution of a novolac resin in methyl isobutyl ketone. To the solution thus obtained, 1000 g of 2-heptanon was added and then methyl isobutyl ketone in the solution was distilled off by an evaporator to obtain a solution of a novolac resin in 2-heptanon. As measured by GPC, the product had a polystyrene-converted weight average molecular weight of 3850.

Synthesis Example 16

A mixture of 33.1 g of 2-cyclohexyl-5-methylphenol, 67.8 g of methanol, 1.8 g of p-toluenesulfonic acid and 9.3 g of salicylaldehyde was allowed to react at 80° C. for 4 hours. After the reaction was completed, 177 g of methyl isobutyl ketone was added to the reaction product and the resulting solution was distilled until the inner temperature rose to 85° C. in order to remove methanol. After 122.7 g of m-cresol and 55.5 g of 2,5-xylenol were added thereto, 115 g 37% aqueous solution of formaldehyde was dropwise added over a period of 60 minutes, and the resulting mixture was allowed to react at 90° C. for 6 hours. Then, the reaction mixture was washed with water and dehydrated to obtain a solution of a novolac resin in methyl isobutyl ketone. To the solution thus obtained, 1000 g of 2-heptanon was added and then methyl isobutyl ketone in the solution was distilled off by an evaporator to obtain a solution of a novolac resin in 2-heptanon. As measured by GPC, the product had a polystyrene-converted weight average molecular weight of 4700.

Synthesis Example 17

100 g of a solution of a novolac resin in methyl isobutyl ketone obtained according to the same manner as in Synthesis Example 11, in which the content of novolac resin was 39.2% by weight, was charged to a 1-liter separable flask equipped with a drain pipe at its bottom. To the flask, 50.7 g of methyl isobutyl ketone and 95 g of n-heptane were further added. The content of the flask was stirred at 60° C. for 30 minutes and then left to stand until it separated into two layers. To the under layer thus obtained 300 g of 2-heptanone was added, after which the methyl isobutyl ketone and n-heptane were removed by means of an evaporator to obtain a solution of novolac resin in 2-heptanone. As measured by GPC, the product thus obtained had a polystyrene-converted weight average molecular weight of 7050, and the areal ratio of the range in which the molecular weight as converted to polystyrene was 900 or less to the total pattern area was 15%.

Synthesis Example 18

100 g of a solution of a novolac resin in methyl isobutyl ketone obtained according to the same manner as in Synthesis Example 12, in which the content of novolac resin was 42% by weight, was charged to a 1-liter separable flask equipped with a drain pipe at its bottom. To the flask, 61.4 g of methyl isobutyl ketone and 101.7 g of n-heptane were further added. The content of the flask was stirred at 60° C. for 30 minutes and then left to stand until it separated into two layers. To the under layer thus obtained 300 g of 2-heptanone was added, after which the methyl isobutyl ketone and n-heptane were removed by means of an evaporator to obtain a solution of novolac resin in 2-heptanone. As measured by GPC, the product thus obtained had a polystyrene-converted weight average molecular weight of 7300, and the areal ratio of the range in which the molecular weight as converted to polystyrene was 900 or less to the total pattern area was 16%.

EXAMPLES

According to the formulation shown in the following Table 1, 2 and 3, a novolac resin (in Table 1, 2 and 3, simply referred to as "resin"), a 1,2-naphthoquinonediazide compound (in Table 1, 2 and 3, simply referred to as "photo sensitizer") and an alkali-soluble polyhydric phenol compound of which molecular weight is less than 900(in Table 1, 2 and 3, simply referred to as "additive b") were mixed and dissolved in 50 parts of 2-heptanone.

The solution thus obtained was filtered through a Teflon filter having a pore size of 0.2 μm to prepare a resist solution. A silicon wafer washed in a conventional manner was coated with the resist solution up to a thickness of 1.06 μm by means of a spin coater and baked on a hot plate at 90° C. for one minute. Subsequently, the wafer was exposed to light by using a reduction projection exposing machine having an exposure wavelength of 365 nm (i-line) (NSR1755i7A, NA=0.5, manufactured by Nikon Corp.) while stepwise changing the amount of exposure.

Subsequently, the wafer was baked on a hot plate at 110° C. for one minute. Then, it was developed for one minute with SOPD (alkaline developing solution; product of Sumitomo Chemical Co., Ltd.) to obtain a positive pattern. A resolution was evaluated by measuring, with a scanning electron microscope, the dimension of the minimum line-and-space pattern which could be resolved without film thickness decrease at an exposure amount giving 1:1 line-and-space(effective sensitivity).

Profile and scum were evaluated by observing, with a scanning electron microscope, the cross-sectional shape of a 0.50 μm line-and-space pattern at the effective sensitivity.

Heat resistance was evaluated by observing the extent of sagging of the resist pattern after being heated on a hot plate at 124° C. for 5 minutes.

The depth of focus was determined by observing, with a scanning electron microscope, a degree of focus shifting where a 0.50 μm line-and-space pattern could be resolved at the effective sensitivity without film thickness decrease.

In Table 1, 2 and 3, the additive B is an alkalisoluble polyhydric phenol compound represented by the following formula:

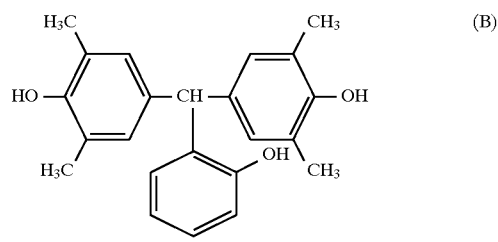

In Table 1, 2 and 3, photo sensitizers C to E are each a condensate formed between 1,2-napthoquinonediazide-5-sulfonic acid chloride and the following phenol compounds C', D' and E', respectively in the molar ratio of 2.6, 2.0 and 4.0, respectively:

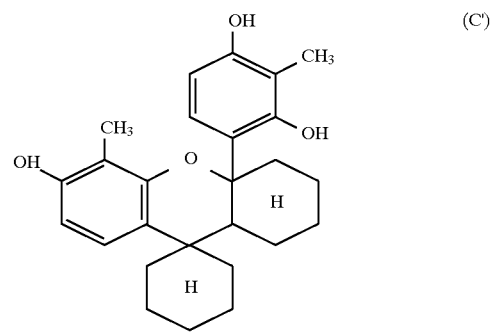

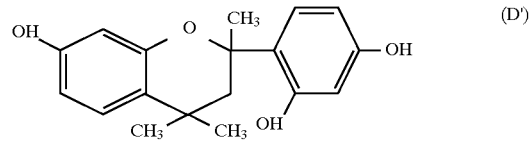

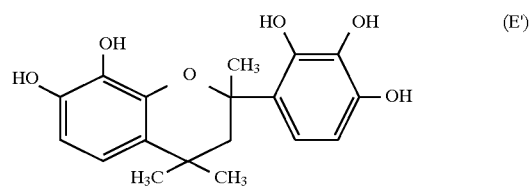

TABLE 1

| Example No. | Formulation of resist | | | Properties of resist | | | | | |
|---|---|---|---|---|---|---|---|---|---|
| | Resin (Synthesis Example No.) | Additive B | Photo-sensitizer | Effective sensitivity | Resolution | Depth of focus | Scum | Heat resistance | Profile |
| 1 | (3) 13.3 parts | 1 part | C 4.5 parts D 0.5 part E 0.5 part | 430 msec | 0.37 $\mu$m | 1.6 $\mu$m | Not found | No sagging observed | |
| 2 | (4) 13.3 parts | 1 part | C 4.5 parts D 0.5 part E 0.5 part | 670 msec | 0.37 $\mu$m | 1.6 $\mu$m | Not found | No sagging observed | |
| 3 | (5) 13.3 parts | 1 part | C 4.5 parts D 0.5 part E 0.5 part | 560 msec | 0.37 $\mu$m | 1.7 $\mu$m | Not found | No sagging observed | |
| 4 | (6) 13.3 parts | 1 part | C 4.5 parts D 0.5 part E 0.5 part | 390 msec | 0.4 $\mu$m | 1.5 $\mu$m | Not found | No sagging observed | |
| 5 | (7) 13.3 parts | 1 part | C 4.5 parts D 0.5 part E 0.5 part | 230 msec | 0.4 $\mu$m | 1.5 $\mu$m | Not found | No sagging observed | |

TABLE 2

| Example No. | Formulation of resist | | | Properties of resist | | | | | |
|---|---|---|---|---|---|---|---|---|---|
| | Resin (Synthesis Example No.) | Additive B | Photo-sensitizer | Effective sensitivity | Resolution | Depth of focus | Scum | Heat resistance | Profile |
| 6 | (8) 12.7 parts | 1.6 parts | C 4.5 parts D 0.5 part E 0.5 part | 540 msec | 0.37 $\mu$m | 1.7 $\mu$m | Not found | No sagging observed | |
| 7 | (9) 10.4 parts | 3.9 parts | C 4.5 parts D 0.5 part E 0.5 part | 530 msec | 0.4 $\mu$m | 1.5 $\mu$m | Not found | No sagging observed | |
| 8 | (10) 10.4 parts | 3.9 parts | C 4.5 parts D 0.5 part E 0.5 part | 450 msec | 0.4 $\mu$m | 1.5 $\mu$m | Not found | No sagging observed | |
| 9 | (11) 13.3 parts | 1.0 part | C 4.5 parts D 0.5 part E 0.5 part | 700 msec | 0.37 $\mu$m | 1.6 $\mu$m | Not found | No sagging observed | |
| 10 | (12) 13.3 parts | 1.0 part | C 4.5 parts D 0.5 part E 0.5 part | 580 msec | 0.37 $\mu$m | 1.6 $\mu$m | Not found | No sagging observed | |

TABLE 3

| Example No. | Formulation of resist | | | Properties of resist | | | | | |
|---|---|---|---|---|---|---|---|---|---|
| | Resin (Synthesis Example No.) | Additive B | Photo-sensitizer | Effective sensitivity | Resolution | Depth of focus | Scum | Heat resistance | Profile |
| 11 | (13) 13.3 parts | 1 part | C 4.5 parts D 0.5 part E 0.5 part | 580 msec | 0.37 $\mu$m | 1.7 $\mu$m | Not found | No sagging observed |  |

TABLE 3-continued

| | Formulation of resist | | | Properties of resist | | | | |
|---|---|---|---|---|---|---|---|---|
| Example No. | Resin (Synthesis Example No.) | Additive B | Photo-sensitizer | Effective sensitivity | Resolution | Depth of focus | Scum | Heat resistance | Profile |
| 12 | (14) 13.3 parts | 1 part | C 4.5 parts D 0.5 part E 0.5 part | 420 msec | 0.37 µm | 1.5 µm | Not found | No sagging observed | |
| 13 | (15) 13.3 parts | 1 part | C 4.5 parts D 0.5 part E 0.5 part | 240 msec | 0.4 µm | 1.5 µm | Not found | No sagging observed | |
| 14 | (16) 12.7 parts | 1.6 parts | C 4.5 parts D 0.5 part E 0.5 part | 330 msec | 0.35 µm | 1.8 µm | Not found | No sagging observed | |
| 15 | (17) 10.4 parts | 3.9 parts | C 4.5 parts D 0.5 part E 0.5 part | 560 msec | 0.4 µm | 1.5 µm | Not found | No sagging observed | |
| 16 | (18) 10.4 parts | 3.9 parts | C 4.5 parts D 0.5 part E 0.5 part | 560 msec | 0.4 µm | 1.5 µm | Not found | No sagging observed | |

Figure 1:
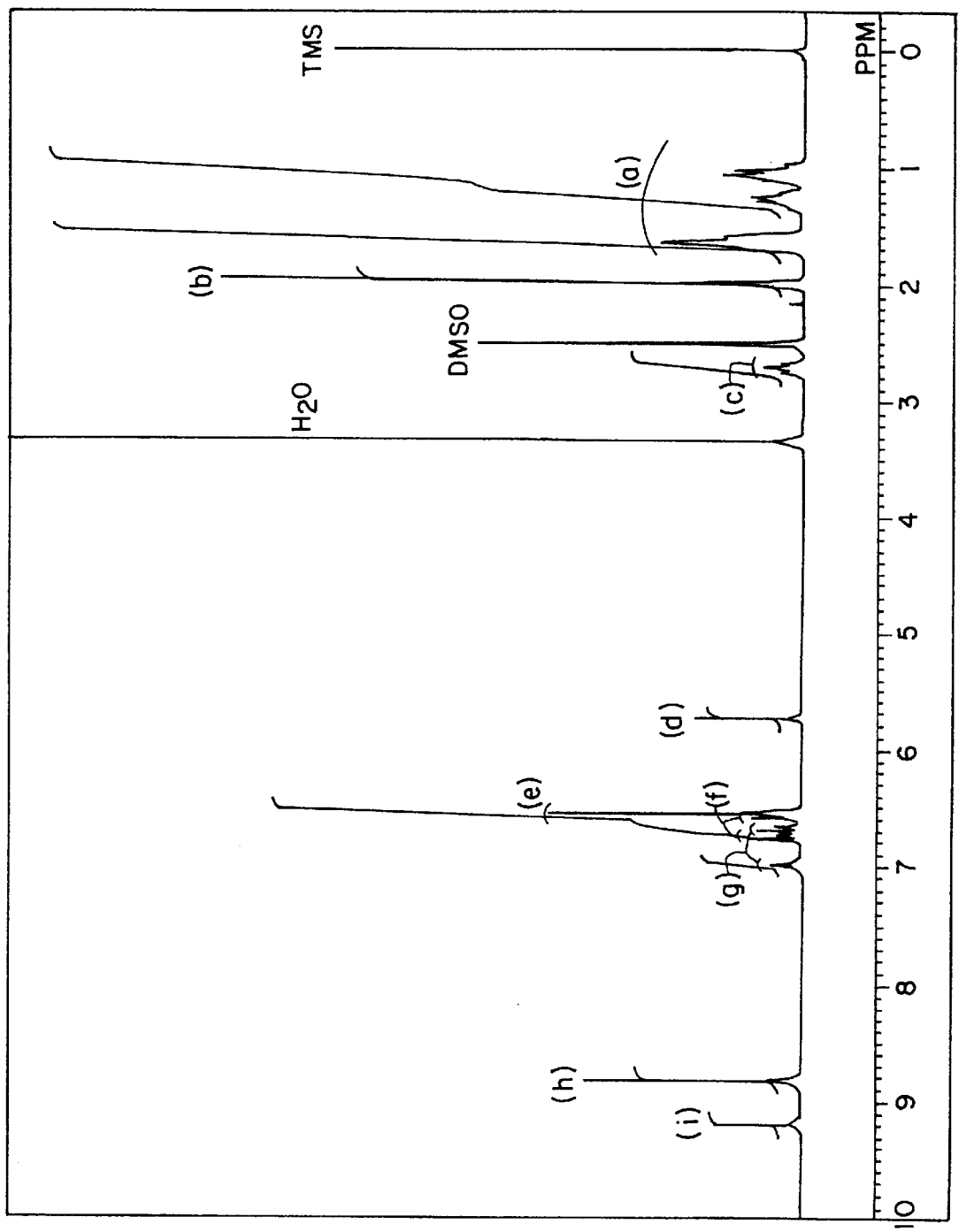
FIG. 1 shows a $^1$H-NMR spectrum of the compound obtained in Synthesis Example 1.
Figure 2:
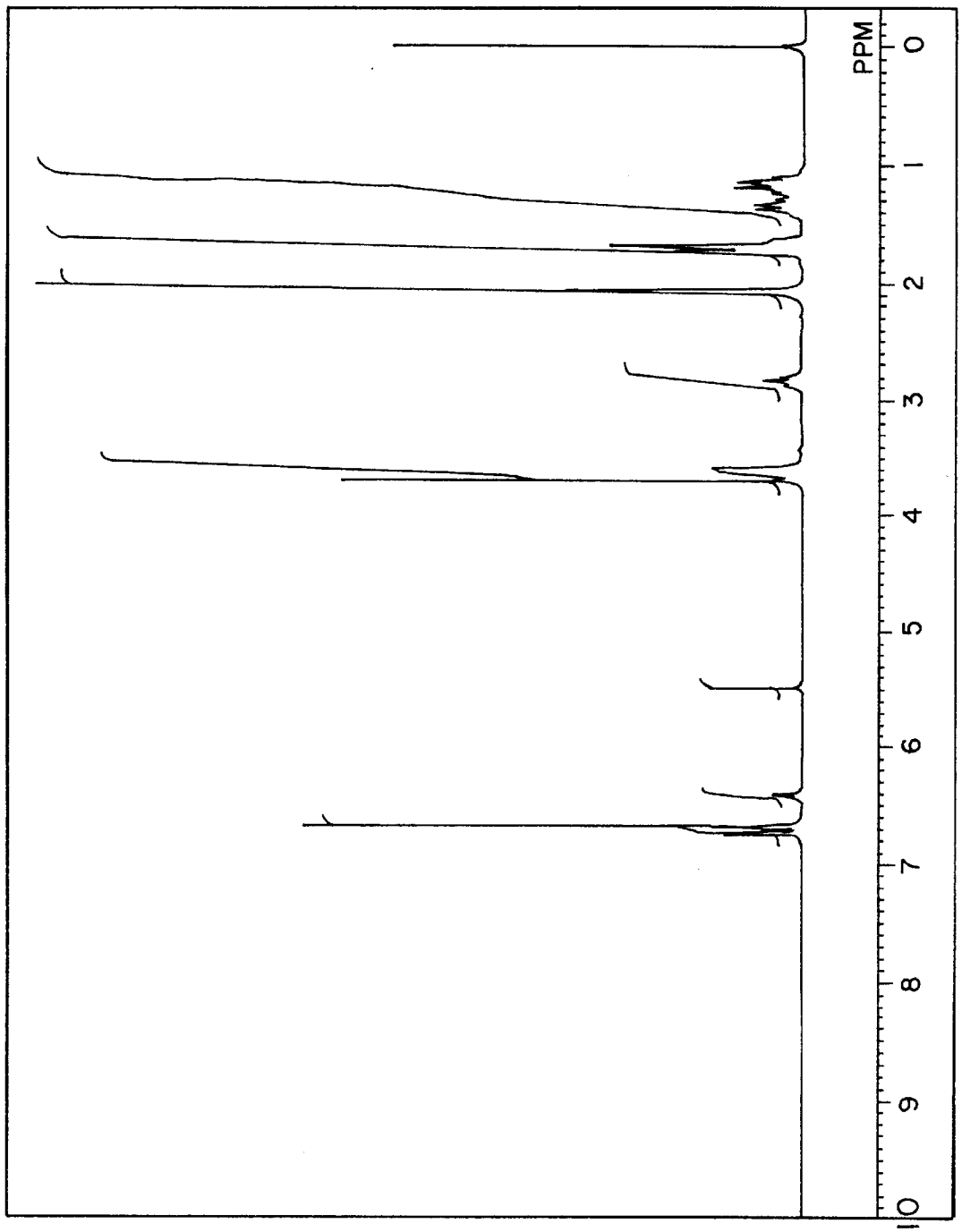
FIG. 2 shows a $^1$H-NMR spectrum of the compound obtained in Synthesis Example 2.

What we claim is:

1. A positive resist composition which comprises;

an o-quinonediazide compound; and a novolac resin which is obtained by allowing aldehydes containing an aromatic aldehyde represented by the following formula(I)

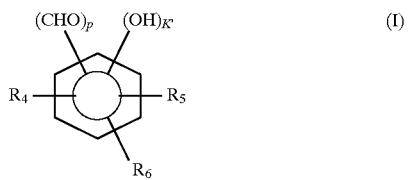

wherein $R_4$ to $R_6$ each independently represent hydrogen, alkyl having 6 or less carbon atoms, cycloalkyl having 6 or less carbon atoms, alkoxy having 6 or less carbon atoms, alkenyl having 6 or less carbon atoms or aryl having 10 or less carbon atoms, k' represents 0, 1, 2 or 3 and p represents 1, 2 or 3, provided that k' and p satisfy k'+p ≦3, to react with a phenol compound represented by the following formula(II)

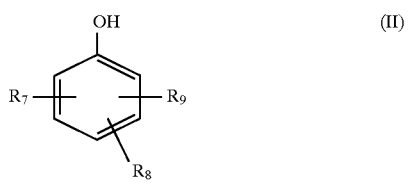

wherein $R_7$ to $R_9$ each independently represent hydrogen, hydroxy, alkyl having 6 or less carbon atoms, cycloalkyl having 6 or less carbon atoms, alkoxy having 6 or less carbon atoms, alkenyl having 6 or less carbon atoms or aryl having 10 or less carbon atoms, provided that at least one of $R_7$ to $R_9$ is cycloalkyl having 6 or less carbon atoms, in the presence of an acid catalyst to obtain a reaction product(1) containing low molecular weight ingredients; and, then, allowing the reaction product(1) to further react with a phenol compound(1) and formaldehyde.

2. A positive resist composition according to claim 1 wherein the reaction product(1) is allowed to further react with a phenol and formaldehyde without isolating the low molecular weight ingredients from the reaction product(1).

3. A positive resist composition according to claim 1 in which the phenol compound represented by the formula(II) is at least one compound selected from 2-cyclohexyl-5-methylphenol and 2-cyclopentyl-5-methylphenol.

4. A positive resist composition according to claim 1 in which the phenol compound(1) is at least one phenol compound selected from a group consisting of phenol, m-cresol, p-cresol, 2,5-xylenol, 3,5-xylenol, 3,4-xylenol, 2,3,5-trimethylphenol, 2-cyclohexyl-5-methylphenol, 2-cyclopentyl-5-methylphenol and 3-methyl-6-t-butylphenol.

5. A positive resist composition according to claim 1 in which the reaction of the aldehyde containing the aromatic aldehyde represented by the formula(I) and the phenol compound represented by the formula(II) is carried out in the presence of an organic solvent having a boiling temperature of 50°–160° C.

6. A positive resist composition according to claim 1 in which the novolac resin(1) is one in which the areal ratio of the GPC pattern of a range, wherein a molecular weight as converted to polystyrene is not higher than 900, is 25% or less based on the total pattern area excluding the pattern area of unreacted phenol compounds, as measured by using a UV 254 nm detector.

7. A positive resist composition which comprises;

an o-quinonediazide compound; and a novolac resin which is obtained by allowing a compound represented by the following formula(III)

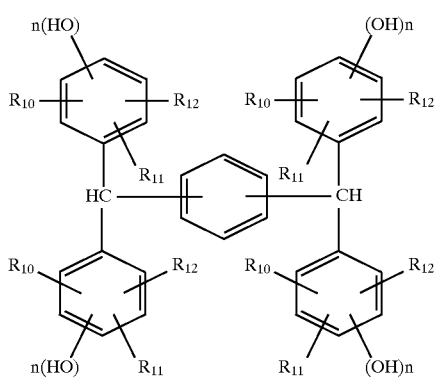

wherein $R_{10}$ to $R_{12}$ each independently represents hydrogen, alkyl having 6 or less carbon atoms, cycloalkyl having 6 or less carbon atoms, alkoxy having 6 or less carbon atoms or alkenyl having 6 or less carbon atoms, provided that at least one of $R_{10}$ to $R_{12}$ is cycloalkyl having 6 or less carbon atoms, and n is 1 or 2; or a compound represented by the following formula(IV):

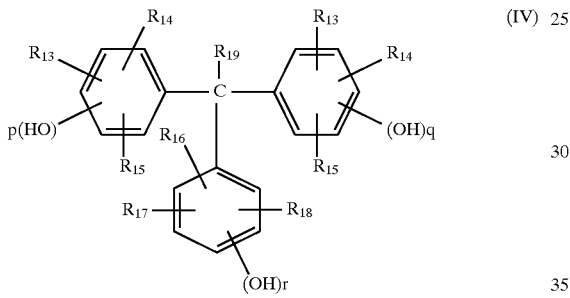

wherein $R_{13}$ to $R_{18}$ each independently represents hydrogen, alkyl having 6 or less carbon atoms, cycloalkyl having 6 or less carbon atoms, alkoxy having 6 or less carbon atoms or alkenyl having 6 or less carbon atoms, $R_{19}$ represents hydrogen, alkyl having 6 or less carbon atoms or aryl having 10 or less carbon atoms, p and q each independently represents 1 or 2 and r represents 0 or 1, provided that at least one of $R_{13}$ to $R_{15}$ is cycloalkyl having 6 or less carbon atoms;

to condensate with a phenol compound represented by the following formula(V):

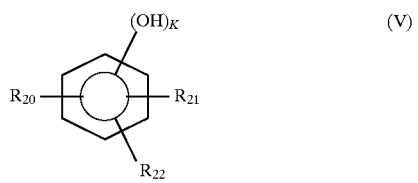

wherein $R_{20}$ to $R_{22}$ each independently represents hydrogen, alkyl having 6 or less carbon atoms, cycloalkyl having 6 or less carbon atoms, alkoxy having 6 or less carbon atoms or alkenyl having 6 or less carbon atoms and k represents 1 or 2; and an aldehyde (1).

8. A positive resist composition according to claim 7 in which the compound of the formula(IV) is one of the compounds represented by the following formulas:

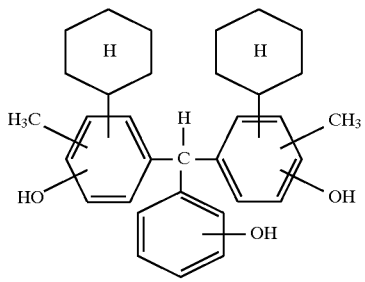

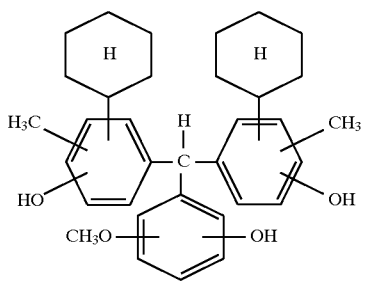

9. A positive resist composition according to claim 7 in which the phenol compound of the formula(V) is at least one phenol compound selected from a group consisting of phenol, m-cresol, p-cresol, 2,5-xylenol, 3,5-xylenol, 3,4-xylenol, 2,3,5-trimethylphenol, 2-cyclohexyl-5-methylphenol, 2-cyclopentyl-5-methylphenol and 3-methyl-6-t-butylphenol.

10. A positive resist composition according to claim 7 in which the molar ratio of the compound of the formula(III) or the compound of the general formula(IV) to the phenol compound of the formula(V) is from 0.5:99.5 to 40:60.

11. A positive resist composition according to claim 7 in which the weight average molecular weight of the novolac resin as converted to polystyrene is 2000–20000.

12. A positive resist composition according to claim 1 or 7 which further contains an alkali-soluble polyhydric phenol compound the molecular weight of which is lower than 900.

13. A positive resist composition according to claim 7 in which the aldehyde(1) is formaldehyde.

* * * * *